US 009648721 B2

(12) United States Patent
Murray, Jr. et al.

(10) Patent No.: US 9,648,721 B2
(45) Date of Patent: May 9, 2017

(54) APPARATUS FOR MOUNTING A PRINTED CIRCUIT BOARD

(71) Applicant: TRW Automotive U.S. LLC, Livonia, MI (US)

(72) Inventors: Neil Gordon Murray, Jr., Wixom, MI (US); Mark Ramsay, Livonia, MI (US)

(73) Assignee: TRW Automotive U.S. LLC, Livonia, MI (US)

( * ) Notice: Subject to any disclaimer, the term of this patent is extended or adjusted under 35 U.S.C. 154(b) by 57 days.

(21) Appl. No.: 14/199,294

(22) Filed: Mar. 6, 2014

(65) Prior Publication Data
US 2015/0257248 A1    Sep. 10, 2015

(51) Int. Cl.
| H05K 1/18 | (2006.01) |
|---|---|
| H05K 1/02 | (2006.01) |
| H05K 5/00 | (2006.01) |
| H05K 5/02 | (2006.01) |

(52) U.S. Cl.
CPC .......... *H05K 1/02* (2013.01); *H05K 1/18* (2013.01); *H05K 5/0034* (2013.01); *H05K 5/0073* (2013.01); *H05K 5/0078* (2013.01); *H05K 5/0221* (2013.01); *H05K 2201/09063* (2013.01); *H05K 2201/1059* (2013.01); *H05K 2201/10401* (2013.01); *H05K 2203/1327* (2013.01); *Y10T 403/471* (2015.01); *Y10T 403/472* (2015.01); *Y10T 403/49* (2015.01)

(58) Field of Classification Search
CPC .......... H05K 1/02; H05K 5/0221; H05K 1/18; H05K 1/181; H05K 5/0073; H05K 5/00; H05K 5/0078; H05K 5/0034; H05K 2201/09063; H05K 2201/10401; H05K 2203/1327; H02G 3/22; Y10T 403/471; Y10T 403/49; Y10T 403/472
USPC ...... 174/25–268, 152 G, 153 G, 138 G, 652, 174/650, 659
See application file for complete search history.

(56) References Cited

U.S. PATENT DOCUMENTS

| 4,521,004 A  * | 6/1985  | Caldwell  ............... | F16F 1/3732 |
|---|---|---|---|
|  |  |  | 267/141.4 |
| 5,363,276 A | 11/1994 | Crockett | |
| 5,879,115 A | 3/1999 | Medal | |
| 6,180,883 B1 | 1/2001 | Copeland | |
| 6,395,985 B1 * | 5/2002 | Djeddah ................ | H01B 17/30 |
|  |  |  | 174/59 |
| 7,116,215 B2 | 10/2006 | Oonishi | |

(Continued)

OTHER PUBLICATIONS

EP 15 15 7937 European Search Report and Written Opinion, completed Jul. 15, 2015.

*Primary Examiner* — Ishwarbhai B Patel
(74) *Attorney, Agent, or Firm* — Tarolli, Sundheim, Covell & Tummino LLP

(57) ABSTRACT

A circuit board mounting arrangement is provided including a circuit board and a press fit mounting bushing including a cylindrical inner piece and an outer piece secured to the inner piece. The outer piece has a plurality of radially projecting, deformable elements and the circuit board has a cylindrical opening having a diameter less than an outer diameter of the radially projecting deformable elements. The deformable elements deform when the mounting bushing is pushed into the cylindrical opening of the circuit board so as to hold the mounting bushing to the circuit board. The circuit board and press fit bushing are then overmolded.

18 Claims, 4 Drawing Sheets

(56) References Cited

U.S. PATENT DOCUMENTS

2010/0018302 A1* 1/2010 Murray, Jr. ......... B60C 23/0408
                                                   73/146.5
2011/0107835 A1   5/2011 Campbell et al.

\* cited by examiner

US 9,648,721 B2

APPARATUS FOR MOUNTING A PRINTED CIRCUIT BOARD

FIELD OF THE INVENTION

The present invention is directed to an apparatus for mounting a printed circuit board ("PCB") to a structure and is particularly directed to a press fit bushing for a PCB used for mounting the PCB to a structure.

BACKGROUND OF THE INVENTION

PCB's are substrates that hold and interconnect electrical circuit components as part of a larger electrical system. PCB's are often mounted into a housing structure designed to hold and protect the PCB and associated circuitry. Various ways of mounting the PCB in the house are known such as by using screws or other attachment means. In such mounting arrangements, the screws are directly received through a mounting hole in the PCB and secured to associated screw support structure of the housing. The housing is then, in turn, typically secured to another structure such as a mounting location within a vehicle.

SUMMARY OF THE INVENTION

In accordance with one embodiment of the present invention, a circuit board mounting arrangement is provided including a circuit board and a press fit mounting bushing including a cylindrical inner piece and an outer piece secured to the inner piece. The outer piece has a plurality of radially projecting, deformable elements and the circuit board has a cylindrical opening having a diameter less than an outer diameter of the radially projecting deformable elements. The deformable elements deform when the mounting bushing is pushed into the cylindrical opening of the circuit board so as to hold the mounting bushing to the circuit board. The circuit board and press fit bushing are then overmolded.

BRIEF DESCRIPTION OF THE DRAWINGS

The foregoing and other features and advantages of the present invention will become apparent to those skilled in the art to which the present invention relates upon reading the following description with reference to the accompanying drawings, in which.

DETAILED DESCRIPTION

Figure 1:
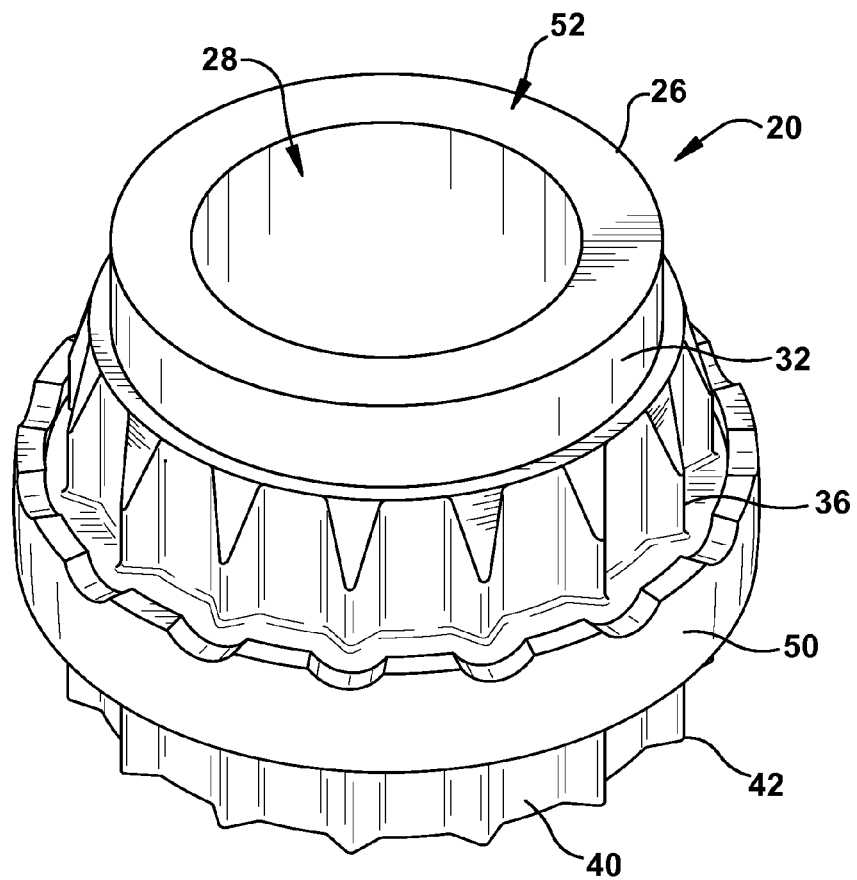
FIG. 1 is a perspective view of a press fit mounting bushing made in accordance with one example embodiment of the present invention that is used for mounting a printed circuit board to a mounting structure.
Figure 2:
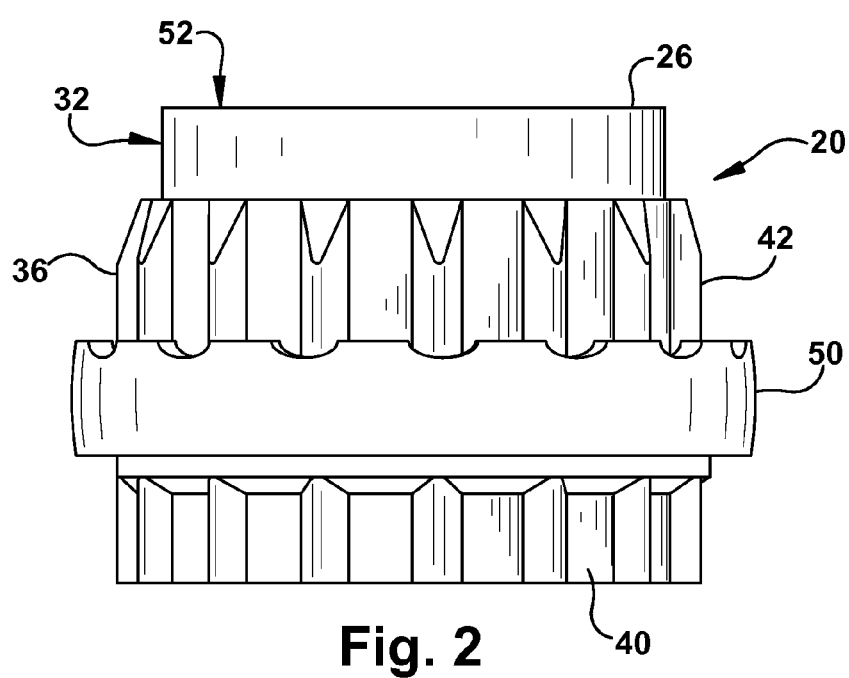
FIG. 2 is side elevation view of the mounting bushing of FIG. 1.
Figure 3:
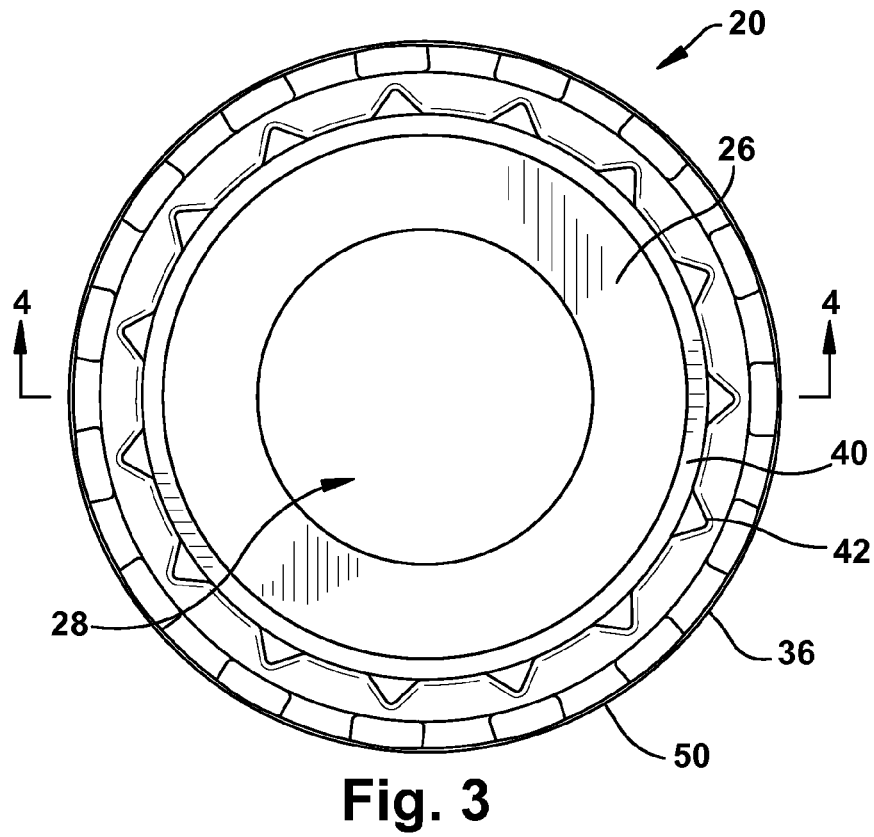
FIG. 3 is a top plan view of the mounting bushing of FIG. 1.
Figure 4:
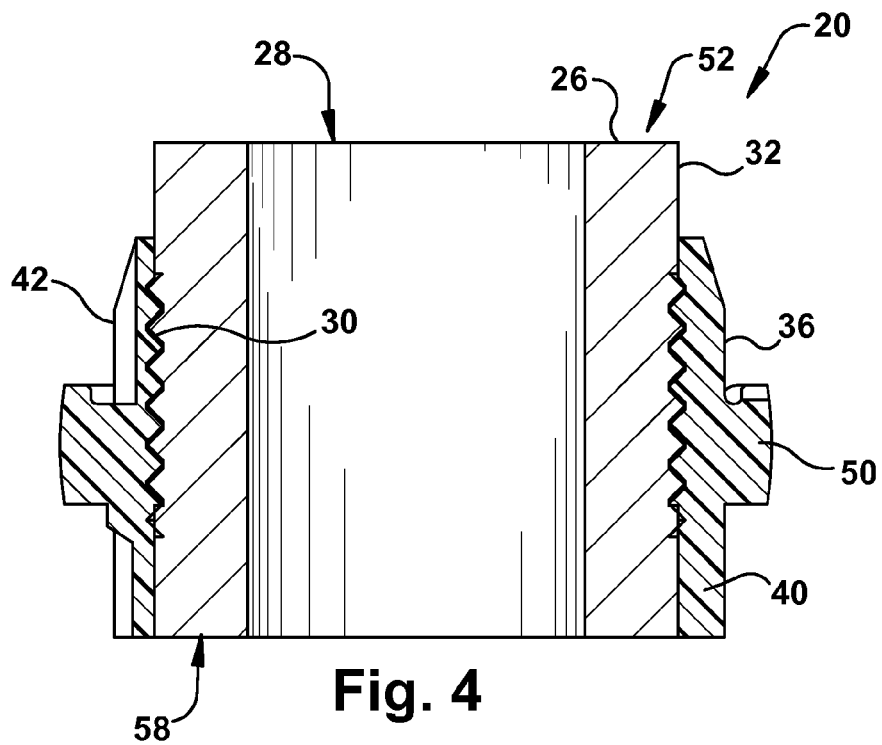
FIG. 4 is a cross-section view of the bushing of FIG. 3 taken along the line 4-4.
Figure 5:
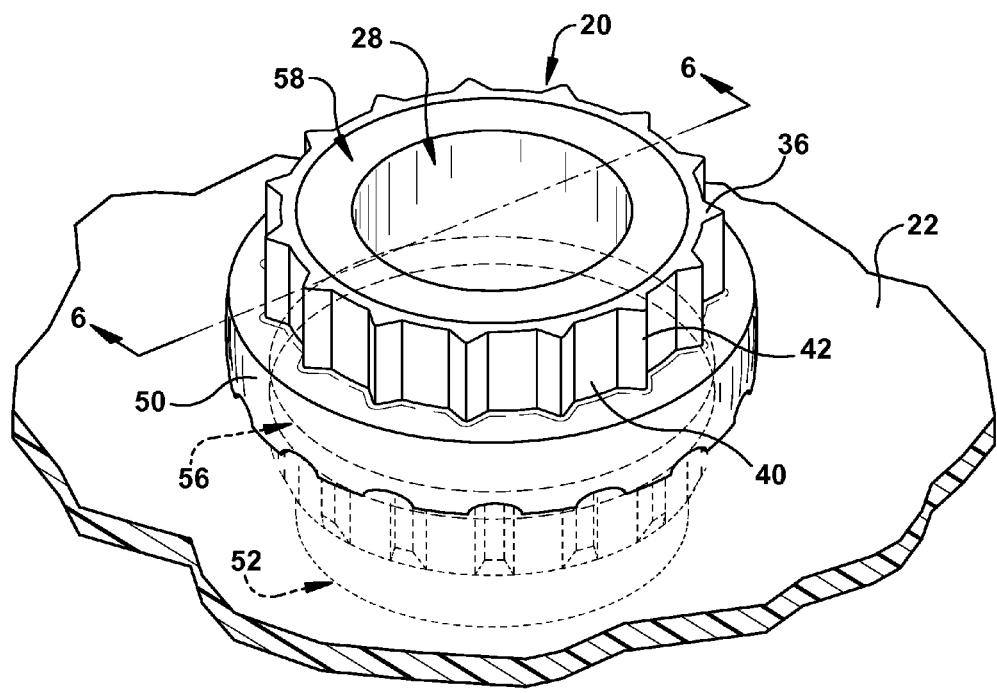
FIG. 5 is a perspective view of the bushing of FIG. 1 press fit into a printed circuit board.
Figure 6:
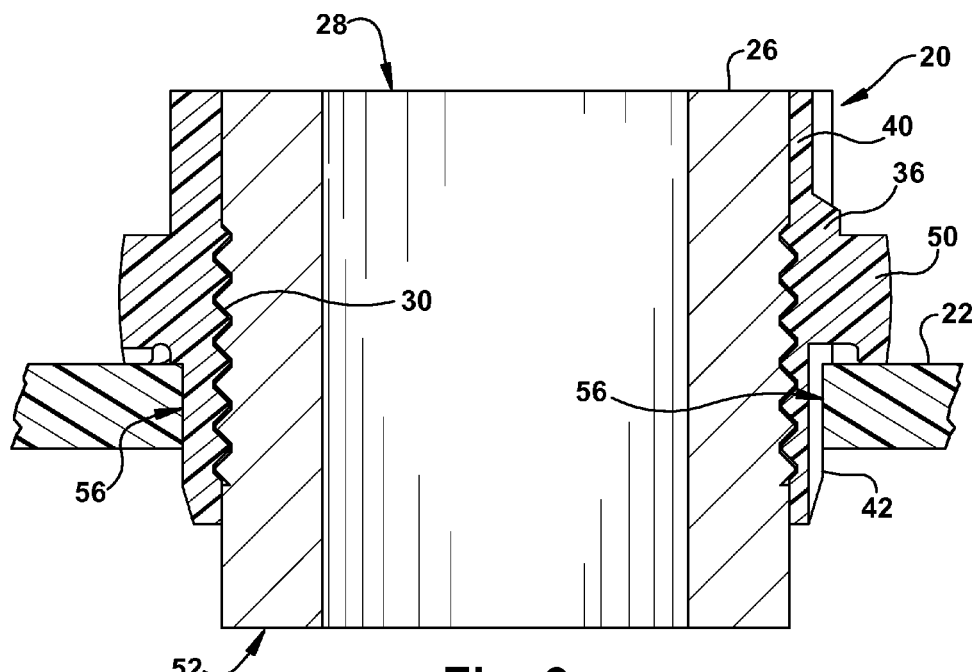
FIG. 6 is a cross-sectional view of the bushing of FIG. 5 taken along the line 6-6.

Referring to FIGS. 1-6, a two piece press fit mounting bushing 20 is shown used for mounting a printed circuit board ("PCB") 22 to a structure. The two piece mounting bushing 20 includes an inner cylindrical piece 26 having a through bore 28. In accordance with one example embodiment of the present invention, the inner cylindrical piece 26 is made from metal. A portion 30 of the outer wall 32 of the inner piece 26 has a knurled surface or, at least, a surface that has a rough texture. The inner piece 26 could be formed through machining, cold forming, or other metal forming processes with the knurled surface.

The two piece mounting bushing 20 further includes an outer piece 36 that circumferentially covers at least an axial portion of the inner cylindrical piece 26 commensurate with the knurled surface. In accordance with one example embodiment of the present invention, the outer piece 36 is made from plastic and is molded to the outer wall 32 and in contact with the knurled portion 30 so as to be adhered and fixed to the inner piece 26. The knurled surface, or otherwise textured surface of the inner piece, provides mechanical retention between the outer piece 36 and the inner piece 26. The outer piece being plastic electrically isolates the inner piece from the printed circuit board 22.

The outer piece 36 of the two piece bushing 20 includes a main body portion 40 and a plurality of radially extending retaining members 42 circumferentially and equally spaced around the main body portion 40. The radially extending retaining members 42 are substantially V-shaped in cross section but could take other forms. The retaining ring 50 radially extends outward from the main body portion 40.

A first end 52 of the two piece mounting bushing 20 is inserted, i.e., press fit, into an opening 56 of the PCB 22. The outside radial diameter of the radially extending retaining members 42 is slightly greater than the diameter of the opening 56 of the PCB 22 such that the bushing 20 must be press fit into the opening with sufficient force applied against end 58. Force would be continuously applied until the retaining ring 50 contacts the PCB 22. During the process of inserting the bushing 20 into the PCB 22, the radially extending retaining members 42 deform slightly and form a tight press fit engagement, i.e., interference fit, with the PCB 22. A bolt may then be inserted through the opening 28 so as to secure the PCB 22 to a mounting structure via a nut on the end of the bolt.

If the press fit mounting bushing were made entirely of metal, such a bushing would cause stress in the PCB board when inserted into the PCB. Also, if the PCB would include a plurality of all metal bushings, the accumulated stress caused by the metal bushings could result in a bowing of the PCB.

Figure 7:
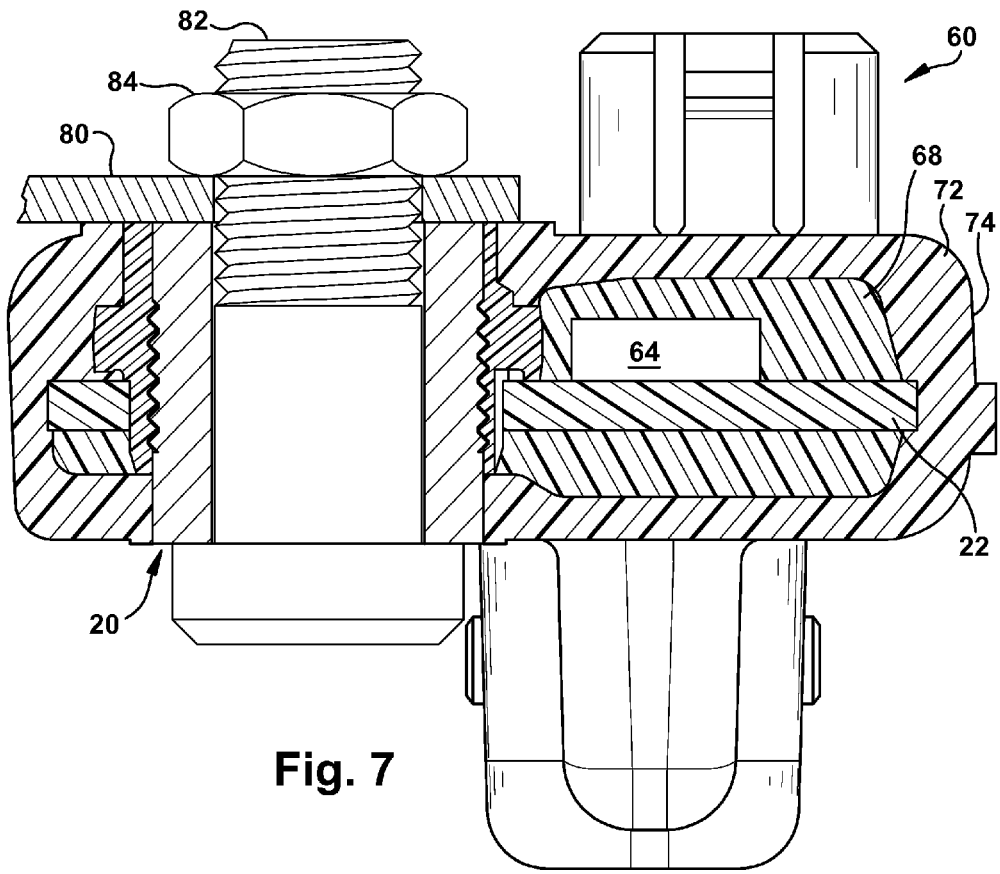
FIG. 7 is a cross-section view of the printed circuit board mounting arrangement of the present invention using the bushing of FIG. 1 showing the circuit board mounted inside of a housing.

Referring to FIG. 7, a completed mounting arrangement 60 for a PCB 22 in accordance with one embodiment of the present invention is shown. The PCB 22 includes circuitry 64 mounted to the PCB 22. In a vehicle application, the circuitry 64 could include vehicle crash sensors such as an accelerometer or a pressure sensor. The bushing 20 is mounted to the PCB 22 as described above with regard to FIGS. 1-6. The two piece bushing 20 is press fit into the circuit board 22 as described above prior to an overmolding process. First, a soft plastic material 68 is molded over the circuitry 64 and a portion of the PCB 22. A hard plastic material 72 is then overmolded the soft plastic material 68, the exposed portions of the PCB 22 and the two piece bushing 20. The hard plastic material forms a rigid mounting case 74 that is formed, i.e., molded, into any desired shape. The rigid mounting case 78 is then, in turn, secured to a mounting structure 80, such as a mounting beam in a vehicle, using a bolt 82 and associated nut 84 through the two piece bushing 20.

An overmolding process showing the soft inner layer and hard outer layer for a vehicle crash sensor arrangement is shown and described in U.S. Pat. No. 8,966,975 which is hereby fully incorporated herein by reference.

Figure 8:
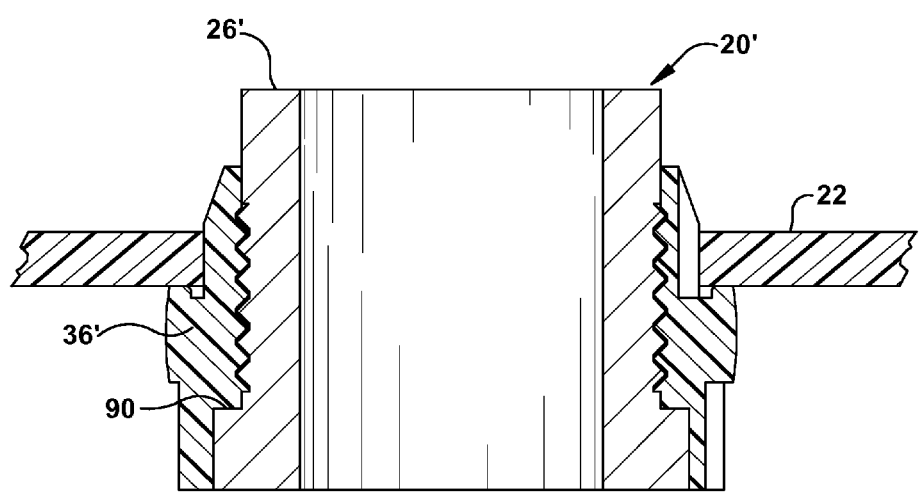
FIG. 8 is a side cross-sectional view of a press fit mounting bushing in accordance with another embodiment of the present invention.

Referring to FIG. 8, another example embodiment is shown of the present invention using a modified two piece press fit bushing 20' for mounting to a PCB 22. The bushing 20' has an inner member 26' made of metal and outer plastic member 36' secured to a knurled portion of the inner member in a similar manner as described above. With this embodiment, the inner member 26' includes a stepped flange portion 90 that provides an additional contact surface to enhance the retention characteristics between the inner member 26' and the outer member 36' of the two piece bushing 20'.

From the above description of the invention, those skilled in the art will perceive improvements, changes and modifications. For example, the retention members have been described, in accordance with one example embodiment, as being V-shaped in cross section. Other shapes or patterns could also be used. Such improvements, changes and modifications within the skill of the art are intended to be covered by the appended claims.

Having described the invention, the following is claimed:

1. A circuit board mounting arrangement comprising:
a circuit board; and
a press fit mounting bushing including a cylindrical inner piece and an outer piece secured to said inner piece, said outer piece having a plurality of radially projecting, deformable elements, said circuit board having a cylindrical opening having a diameter less than an outer diameter of said radially projecting deformable elements of said outer layer, said deformable elements deforming when said mounting bushing is pushed into said cylindrical opening of said circuit board so as to hold said mounting bushing to said circuit board, wherein each of said deformable elements extends axially through the entire opening in said circuit board.

2. The circuit board mounting arrangement of claim 1 wherein said cylindrical inner piece is made from metal and has a knurled outer surface and wherein said outer piece is plastic and is secured to said knurled surface of said cylindrical inner piece.

3. The circuit board mounting arrangement of claim 2 wherein said circuit board and said press fit mounting bushing are overmolded with plastic material so as to protect any circuitry on said mounting board and to provide a housing.

4. The circuit board mounting arrangement of claim 3 wherein said housing is mounted to a structure using a threaded fastener.

5. The circuit board mounting arrangement of claim 2 wherein said outer piece is molded to said inner piece.

6. The circuit board mounting arrangement of claim 1 wherein said deformable elements are generally V-shaped in cross section.

7. The circuit board mounting arrangement of claim 6, wherein each V-shaped deformable element has a length extending axially along the mounting bushing.

8. The circuit board mounting arrangement of claim 1 further comprising a retaining ring extending radially outward from the outer piece, the deformable elements being provided on opposite sides of the retaining ring.

9. A circuit board mounting arrangement comprising:
a circuit board including a cylindrical opening;
a press fit mounting bushing comprising:
a cylindrical inner piece constructed of metal and having a cylindrical through bore and a cylindrical outer wall; and
a plastic outer piece overmolded onto the metal inner piece to adhere and fix the outer piece to the inner piece, the outer piece comprising:
a circumferentially extending retaining ring;
a first series of radially projecting retaining members spaced annularly about the circumference of the outer piece adjacent a first axial end of the retaining ring;
a second series of radially projecting retaining members spaced annularly about the circumference of the outer piece adjacent a second axial end of the retaining ring, opposite the first axial end of the retaining ring;
wherein the retaining ring has a diameter greater than an outer diameter of the first series of retaining members and the second series of retaining members;
wherein the first series of retaining members are press-fit into the cylindrical opening of the circuit board, the retaining members deforming and engaging the circuit board opening so as to connect the mounting bushing to the circuit board.

10. The circuit board mounting arrangement recited in claim 9, wherein the retaining ring engages the circuit board when the first series of retaining members are press-fit into the cylindrical opening.

11. The circuit board mounting arrangement recited in claim 9, wherein the retaining ring comprises an annular rim that is presented toward the first series of retaining members and that engages circuit board when the mounting bushing is press-fit into the cylindrical opening, the annular rim comprising a series of recesses spaced annularly about the rim and defining a series of annularly spaced circuit board engaging surfaces of the of the rim.

12. The circuit board mounting arrangement recited in claim 9, further comprising a plastic overmold that at least partially covers the circuit board and the press-fit mounting bushing, the plastic overmold engaging and conforming to the second series of retaining members, which bolsters the connection between the mounting bushing and the plastic overmold.

13. The circuit board mounting arrangement recited in claim 9, wherein the outer wall of the inner piece comprises a textured surface for facilitating an overmolded connection, and wherein the molded plastic of the outer piece engages the textured surface to adhere and fix the outer piece to the inner piece.

14. A circuit board mounting arrangement comprising:
a press fit mounting bushing comprising a first series of radially projecting retaining members spaced annularly about the circumference of the mounting bushing, and
a second series of radially projecting retaining members spaced annularly about the circumference of the mounting bushing, the first series of retaining members being separate from and spaced axially from the second series of retaining members;
a circuit board including a cylindrical opening, wherein the first series of retaining members are press-fit into the cylindrical opening of the circuit board, the retaining members deforming and engaging the circuit board opening so as to connect the mounting bushing to the circuit board; and a plastic overmold that at least partially covers the circuit board and the press-fit mounting bushing, the plastic overmold engaging and conforming to the second series of retaining members, which bolsters the connection between the mounting bushing and the plastic overmold.

15. The circuit board mounting arrangement recited in claim 14, wherein the press fit mounting bushing comprises a cylindrical inner piece constructed of metal and having a cylindrical through bore and a cylindrical outer wall, and a plastic outer piece overmolded onto the metal inner piece so that the molded plastic engages the textured surface to adhere and fix the outer piece to the inner piece, the outer piece including the first and second series of retaining members and a circumferentially extending retaining ring positioned between the first and second series of retaining members.

16. The circuit board mounting arrangement recited in claim 15, wherein the retaining ring engages the circuit board when the first series of retaining members are press-fit into the cylindrical opening.

17. The circuit board mounting arrangement recited in claim 15, wherein the retaining ring comprises an annular rim that is presented toward the first series of retaining members and that engages circuit board when the mounting bushing is press-fit into the cylindrical opening, the annular rim comprising a series of recesses spaced annularly about the rim and defining a series of annularly spaced circuit board engaging surfaces of the of the rim.

18. The circuit board mounting arrangement recited in claim 15, wherein the outer wall of the inner piece comprises a textured surface for facilitating an overmolded connection, and wherein the molded plastic of the outer piece engages the textured surface to adhere and fix the outer piece to the inner piece.

* * * * *